US012592292B2

(12) United States Patent
Yan

(10) Patent No.: US 12,592,292 B2
(45) Date of Patent: Mar. 31, 2026

(54) EFUSE UNIT AND APPLICATION CIRCUIT THEREOF

(71) Applicant: Shanghai Huali Integrated Circuit Corporation, Shanghai (CN)

(72) Inventor: Ying Yan, Shanghai (CN)

(73) Assignee: Shanghai Huali Integrated Circuit Corporation, Shanghai (CN)

( * ) Notice: Subject to any disclaimer, the term of this patent is extended or adjusted under 35 U.S.C. 154(b) by 103 days.

(21) Appl. No.: 18/440,635

(22) Filed: Feb. 13, 2024

(65) Prior Publication Data

US 2024/0312545 A1 Sep. 19, 2024

(30) Foreign Application Priority Data

Mar. 14, 2023 (CN) .......................... 202310240067.1

(51) Int. Cl.
*G11C 17/16* (2006.01)
*G11C 17/18* (2006.01)
*H03K 19/20* (2006.01)

(52) U.S. Cl.
CPC .............. *G11C 17/16* (2013.01); *G11C 17/18* (2013.01); *H03K 19/20* (2013.01)

(58) Field of Classification Search
CPC ....... G11C 17/16; G11C 17/18; G11C 17/165; H03K 19/20; H01L 23/5256; H01L 23/528; H01L 23/5286
See application file for complete search history.

(56) References Cited

U.S. PATENT DOCUMENTS

| | | | | |
|---|---|---|---|---|
| 2013/0182518 A1* | 7/2013 | Kim | ........................ | G11C 17/18 |
| | | | | 365/201 |
| 2021/0125678 A1* | 4/2021 | Cho | ........................ | G11C 17/18 |
| 2023/0386590 A1* | 11/2023 | Yan | ........................ | G11C 17/16 |
| 2025/0087285 A1* | 3/2025 | Chang | .................. | H10D 30/024 |

* cited by examiner

*Primary Examiner* — Zhuo H Li
(74) *Attorney, Agent, or Firm* — Quarles & Brady LLP

(57) ABSTRACT

The present invention discloses an efuse unit, including a first fuse, a second fuse, a first NMOS, a second NMOS and a third NMOS. One end of the first fuse serves as a Q1 port, and the other end is connected to drain end of the third NMOS and the first NMOS. One end of the second fuse serves as a Q2 port and is short-circuited to a source end of the third NMOS, and the other end is connected to a drain end of the second NMOS. Agate end of the third NMOS serves as an RDWL port. A gate end of the first NMONS serves as a WLC port. A gate end of the second NMOS serves as a WL port. The present invention can improve the correctness of the reading operation, reduce the voltage required for the programming operation, reduce the programming current.

6 Claims, 6 Drawing Sheets

EFUSE UNIT AND APPLICATION CIRCUIT THEREOF

CROSS-REFERENCES TO RELATED APPLICATIONS

This application claims the priority to Chinese patent application No. CN202310240067.1, filed on Mar. 14, 2023, and entitled "EFUSE UNIT AND APPLICATION CIRCUIT THEREOF," the disclosure of which is incorporated herein by reference in its entirety.

TECHNICAL FIELD

The present invention belongs to the field of integrated circuit design technology, and particularly relates to an efuse unit and an application circuit thereof.

BACKGROUND

Efuse belongs to a One-Time Programmable (OTP) memory, which is based on the principle of electromigration (EM) and achieves programming functions by blowing a fuse. An internal reading module of efuse converts the resistance of the fuse into corresponding logical values. Its working principle is to compare the resistance of the fuse before and after blowing with the resistance of a reference resistor through a comparison circuit to generate different levels.

A conventional efuse unit, based on the principle of electromigration, achieves programming operations by blowing a fuse, then compares the resistance of the fuse after programming with the resistance of the reference resistor through a Sense Amplifier (SA) module, and generates corresponding logical output values. A conventional efuse unit is composed of one fuse and one NMOS control transistor. Referring to FIG. 1, the NMOS control transistor controls programming current to flow through the fuse, causing electromigration on the fuse, thus changing the resistance of the fuse. A Q end of the efuse unit serves as an input end of the programming current during programming operations. During reading operations, the Q end is connected to the SA module, which generates reading current from the Q end through a fuse link1 and the NMOS control transistor Mn1 to the ground. The resistance after the fuse is blown determines the logical output value of the SA module. The SA module converts the increased resistance into a corresponding logical value 1. If there are special or unexpected reasons (programming voltage, programming time, fuse characteristics, etc.) in the programming process, the conventional efuse may experience the situation such as the fuse not being blown or the resistance of the fuse being too small after programming, resulting in the SA module outputting an incorrect logical value 0 after comparing the resistance of the reference resistor with the resistance of the fuse, so that the reliability of the entire efuse is obviously decreased.

In order to improve the programming reliability, the conventional efuse often uses a double bit working mode during on-site programming, as illustrated in FIG. 2. During programming, the efuse writes the same data content to two units (efuse A and efuse B), and the data in the two units are backed up to each other. During the reading operation, the efuse performs logical conversion on the content in the two units simultaneously. During outputting, it performs an OR logical operation on two logical values as a final output Dout. It can be seen that this method is based on the lower probability of simultaneous programming failure of the two efuse units.

SUMMARY

The technical problem to be solved by the present invention is to provide an efuse unit and an application circuit thereof, which can improve the correctness of the reading operation, reduce the voltage required for the programming operation, reduce the programming current, reduce the power consumption in programming, and reduce the overall area.

In order to solve the technical problem, the efuse unit provided in the present invention includes a first fuse link1, a second fuse link2, a first NMOS transistor Mn1, a second NMOS transistor Mn2 and a third NMOS transistor Mn3.

One end of the first fuse link1 serves as a Q1 port of the efuse unit, and the other end is connected to a drain end of the third NMOS transistor Mn3 and a drain end of the first NMOS transistor Mn1.

One end of the second fuse link2 serves as a Q2 port of the efuse unit and is short-circuited to a source end of the third NMOS transistor Mn3, and the other end is connected to a drain end of the second NMOS transistor Mn2.

A source end of the first NMOS transistor Mn1 and a source end of the second NMOS transistor Mn2 are connected to the ground.

A gate end of the third NMOS transistor Mn3 serves as an RDWL port of the efuse unit.

A gate end of the first NMOS transistor Mn1 serves as a WLC port of the efuse unit.

A gate end of the second NMOS transistor Mn2 serves as a WL port of the efuse unit.

In order to solve the technical problem, the application circuit of the efuse unit provided in the present invention includes a first PMOS transistor Mp1, a second PMOS transistor Mp2 and an SA module.

A drain end BLA of the first PMOS transistor Mp1 is connected to the Q1 port of the efuse unit.

A drain end BLB of the second PMOS transistor Mp2 is connected to the Q2 port of the efuse unit.

Source ends of the first PMOS transistor Mp1 and the second PMOS transistor Mp2 are short-circuited to a programming power supply VDDQ.

Gate ends of the first PMOS transistor Mp1 and the second PMOS transistor Mp2 are short-circuited to a bit line control signal BLC.

The Q1 port of the efuse unit is connected to the SA module.

Exemplarily, the SA module includes a comparator, a zeroth voltage dividing resistor R0, a first voltage dividing resistor R1, a reference resistor Ref, a fourth NMOS transistor Mn4, a fifth NMOS transistor Mn5 and a sixth NMOS transistor Mn6.

A drain end of the sixth NMOS transistor Mn6 and one end of the first voltage dividing resistor R1 are short-circuited to a negative input end of the comparator.

A source end of the sixth NMOS transistor Mn6 is connected to the Q1 port of the efuse unit.

A drain end of the fifth NMOS transistor Mn5 and one end of the zeroth voltage dividing resistor R0 are short-circuited to a positive input end of the comparator.

A source end of the fifth NMOS transistor Mn5 is connected to one end of the reference resistor Ref, and a gate end is connected to a reading operation signal RD.

A drain end of the fourth NMOS transistor Mn4 is connected to the other end of the reference resistor Ref, and a source end is connected to the ground GND.

Agate end of the fourth NMOS transistor Mn4, the other end of the first voltage dividing resistor R1 and the other end of the zeroth voltage dividing resistor R0 are all connected to a working power supply VDD.

Exemplarily, the voltage of the programming power supply VDDQ is lower than the voltage of the working power supply VDD.

Exemplarily, the resistance of the zeroth voltage divider R0 and the resistance of the first voltage dividing resistor R1 are the same.

Exemplarily, a logical AND operation is performed on a programming operation signal PR, a reverse of the read operation signal RD and a word line selection signal WL through an AND gate to output a word line control signal WLC to the WLC port of the efuse unit.

The word line selection signal WL is connected to the WL port of the efuse unit.

Exemplarily, a logical AND operation is performed on the reading operation signal RD and the word line selection signal WL through an AND gate to output a reading operation control signal RDWL to the RDWL port of the efuse unit.

For the efuse unit provided in the present invention, two fuses are provided in the unit as a 6-port (Q1, Q2, WL, WLC, RDWL, and GND) device with two fuses and three NMOS control transistors. During the programming operation, the two fuses are operated simultaneously, and the overall programming effect of the two fuses (i.e., the sum of the programming resistance of the two fuses) is used for improving the reliability of the reading operation. That is, the two fuses are connected in series during the reading operation. If one fuse is abnormal and not blown or the programming effect is not good, the other normal fuse is normally blown to compensate, so that the overall fuse resistance satisfies the condition for the resistance required by the reading operation. When one fuse has the problem that the programming resistance is too small, it can also ensure that the overall output in the reading operation is correct, avoiding reading operation failure, thus achieving the efuse backup function in the conventional double bit mode. Moreover, even if the two fuses fail, i.e., the programming resistance is small, due to series connection, the sum of the resistance thereof can still improve the correctness of the reading operation, thus improving the reliability of efuse. In addition, by reading the sum of the resistance of the two fuses, the requirement for the minimum resistance of each fuse after blowing is halved. This efuse unit allows an efuse system to adopt to adopt non fusible programming operations, which can reduce the voltage required for the programming operation, reduce the programming current, reduce the power consumption in programming, and reduce the overall area.

DESCRIPTION OF THE DRAWINGS

In order to describe the technical solution of the present invention more clearly, the drawings required for use in the present invention will be briefly introduced. Apparently, the drawings described below are only some embodiments of the present invention. For those skilled in the art, other drawings may be obtained based on these drawings without contributing any inventive labor.

DETAILED DESCRIPTION OF THE APPLICATION

The technical solution in the embodiments of the present invention will be described below clearly and completely with reference to the drawings in the embodiments of the present invention. Apparently, the described embodiments are only a part of the embodiments of the present invention, not all of them. Based on the embodiments of the present invention, all other embodiments obtained by those skilled in the art without contributing any inventive labor still fall within the scope of protection of the present invention.

Words such as "first" and "second" used in the present invention do not indicate any order, quantity, or importance, but are only intended to distinguish different components. Words such as "including" or "comprising" refer to components or objects that appear before the words, including those listed after the words and their equivalents, without excluding other components or objects. Word such as "connecting" or "connected" are not limited to a physical or mechanical connection, but may include an electrical connection, whether direct or indirect. "Up", "down", "left", "right" and the like are only intended to represent relative positional relationships. When the absolute position of a described object changes, the relative positional relationship may also change correspondingly.

It should be noted that, without any conflict, the embodiments and features in the embodiments of the present invention may be freely combined with each other.

Embodiment 1

Figure 1:
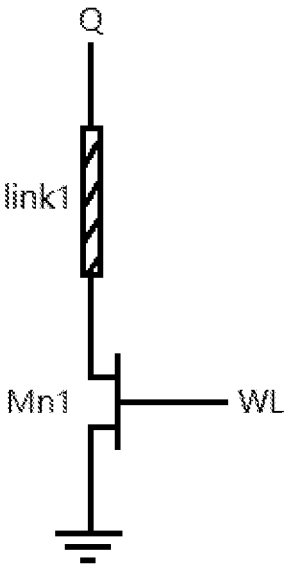
FIG. 1 illustrates a structural schematic diagram of a conventional efuse.
Figure 2:
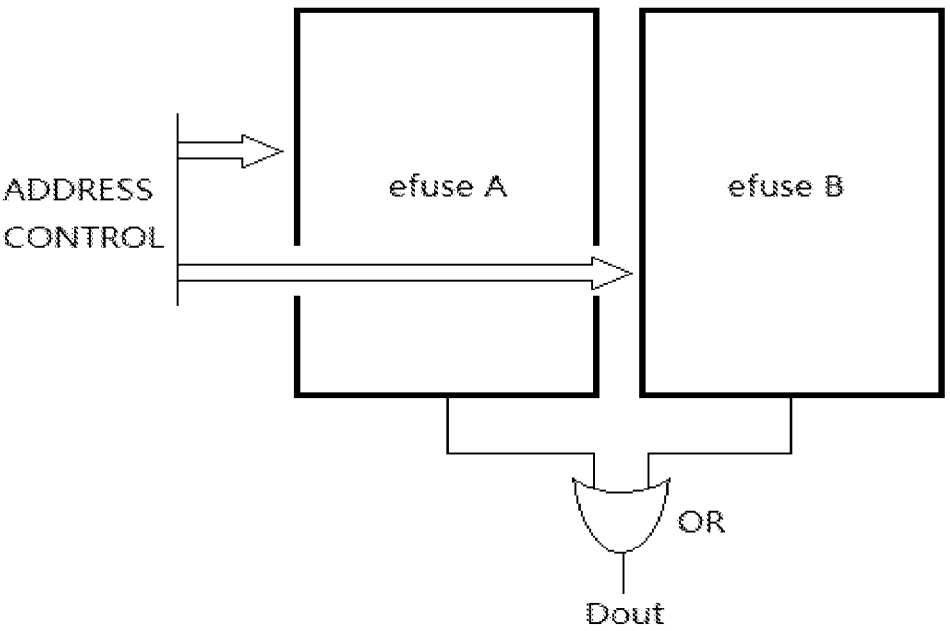
FIG. 2 illustrates a schematic diagram of a conventional efuse working in a double bit mode.
Figure 3:
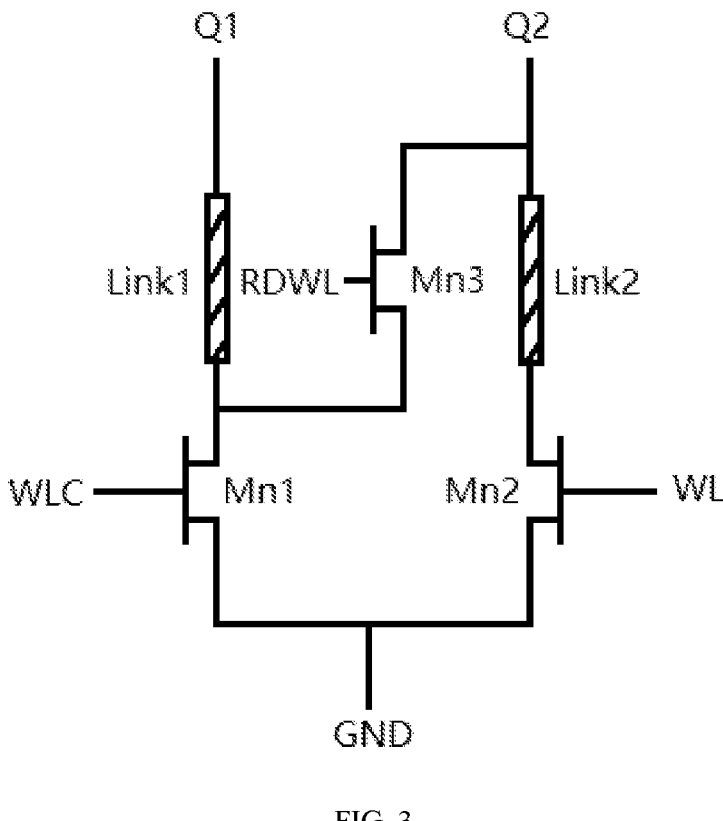
FIG. 3 illustrates a schematic diagram of an efuse unit according to an embodiment of the present invention.

Referring to FIG. 3, an efuse unit includes a first fuse link1, a second fuse link2, a first NMOS transistor Mn1, a second NMOS transistor Mn2 and a third NMOS transistor Mn3.

One end of the first fuse link1 serves as a Q1 port of the efuse unit, and the other end is connected to a drain end of the third NMOS transistor Mn3 and a drain end of the first NMOS transistor Mn1.

One end of the second fuse link2 serves as a Q2 port of the efuse unit and is short-circuited to a source end of the third NMOS transistor Mn3, and the other end is connected to a drain end of the second NMOS transistor Mn2.

A source end of the first NMOS transistor Mn1 and a source end of the second NMOS transistor Mn2 are connected to the ground.

Agate end of the third NMOS transistor Mn3 serves as an RDWL port of the efuse unit.

A gate end of the first NMOS transistor Mn1 serves as a WLC port of the efuse unit.

A gate end of the second NMOS transistor Mn2 serves as a WL port of the efuse unit.

For the efuse unit according to embodiment 1, two fuses are provided in the unit as a 6-port (Q1, Q2, WL, WLC, RDWL, and GND) device with two fuses and three NMOS control transistors. During the programming operation, the two fuses are operated simultaneously, and the overall programming effect of the two fuses (i.e., the sum of the programming resistance of the two fuses) is used for improving the reliability of the reading operation. That is, the two fuses are connected in series during the reading operation. If one fuse is abnormal and not blown or the programming effect is not good, the other normal fuse is normally blown to compensate, so that the overall fuse resistance satisfies the condition for the resistance required by the reading operation. When one fuse has the problem that the programming resistance is too small, it can also ensure that the overall output in the reading operation is correct, avoiding reading operation failure, thus achieving the efuse backup function in the conventional double bit mode. Moreover, even if the two fuses fail, i.e., the programming resistance is small, due to series connection, the sum of the resistance thereof can still improve the correctness of the reading operation, thus improving the reliability of efuse. In addition, by reading the sum of the resistance of the two fuses, the requirement for the minimum resistance of each fuse after blowing is halved. This efuse unit allows an efuse system to adopt non fusible programming operations, which can reduce the voltage required for the programming operation, reduce the programming current, reduce the power consumption in programming, and reduce the overall area.

Embodiment 2

Figure 4:
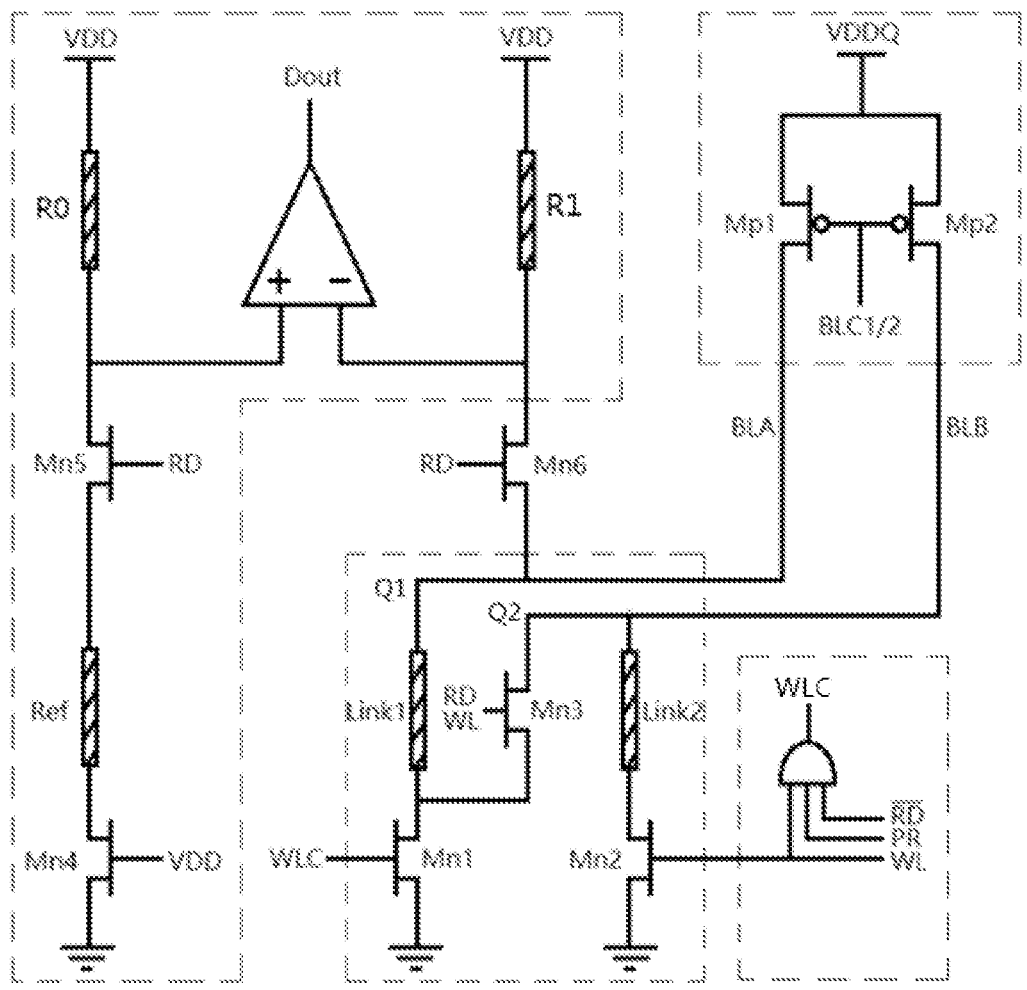
FIG. 4 illustrates a circuit diagram of an application circuit of an efuse unit according to an embodiment of the present invention.

An application circuit of the efuse unit according to embodiment 1, as illustrated in FIG. 4, includes a first PMOS transistor Mp1, a second PMOS transistor Mp2 and an SA (Sense Amplifier) module.

A drain end BLA of the first PMOS transistor Mp1 is connected to the Q1 port of the efuse unit.

A drain end BLB of the second PMOS transistor Mp2 is connected to the Q2 port of the efuse unit.

Source ends of the first PMOS transistor Mp1 and the second PMOS transistor Mp2 are short-circuited to a programming power supply VDDQ.

Gate ends of the first PMOS transistor Mp1 and the second PMOS transistor Mp2 are short-circuited to a bit line control signal BLC (BLC1 and BLC2).

The Q1 port of the efuse unit is connected to the SA module.

For the application circuit of the efuse unit in embodiment 2, the gate ends of the first PMOS transistor Mp1 and the second PMOS transistor Mp2 are short-circuited to the bit line control signal BLC (BLC1 and BLC2) to form a programming path, and the drain ends of the first PMOS transistor Mp1 and the second PMOS transistor Mp2 are respectively connected to the Q1 port and Q2 port of the efuse unit.

Figure 5:
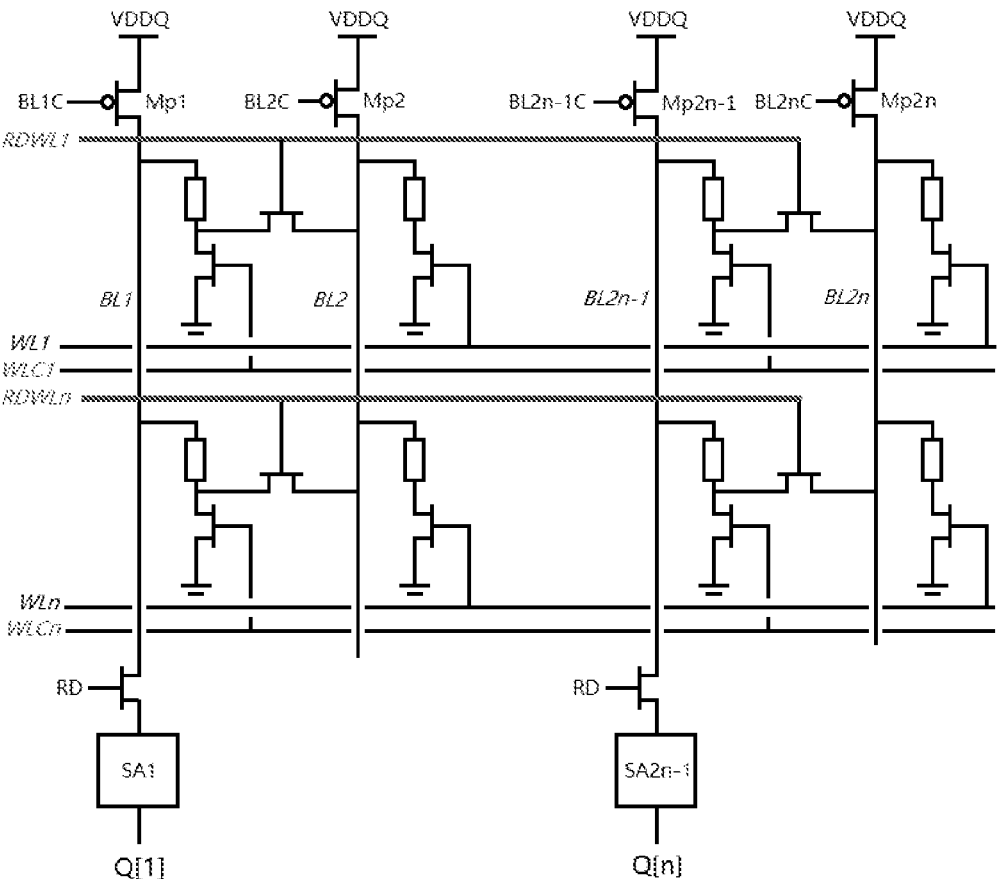
FIG. 5 illustrates a schematic diagram of an array of application circuits of efuse units according to an embodiment of the present invention.

An array adopting the application circuits of the efuse units is as illustrated in FIG. 5. It can reduce the number of SA modules by half, thus reducing the overall area and reducing the power consumption in the reading operation.

Embodiment 3

Based on the application circuit of the efuse unit in embodiment 2, the SA module includes a comparator, a zeroth voltage dividing resistor R0, a first voltage dividing resistor R1, a reference resistor Ref, a fourth NMOS transistor Mn4, a fifth NMOS transistor Mn5 and a sixth NMOS transistor Mn6.

A drain end of the sixth NMOS transistor Mn6 and one end of the first voltage dividing resistor R1 are short-circuited to a negative input end of the comparator.

A source end of the sixth NMOS transistor Mn6 is connected to the Q1 port of the efuse unit.

A drain end of the fifth NMOS transistor Mn5 and one end of the zeroth voltage dividing resistor R0 are short-circuited to a positive input end of the comparator.

A source end of the fifth NMOS transistor Mn5 is connected to one end of the reference resistor Ref, and a gate end is connected to a reading operation signal RD.

A drain end of the fourth NMOS transistor Mn4 is connected to the other end of the reference resistor Ref, and a source end is connected to the ground GND.

A gate end of the fourth NMOS transistor Mn4, the other end of the first voltage dividing resistor R1 and the other end of the zeroth voltage dividing resistor R0 are all connected to a working power supply VDD.

Exemplarily, the voltage of the programming power supply VDDQ is lower than the voltage of the working power supply VDD.

Exemplarily, the resistance of the zeroth voltage divider R0 and the resistance of the first voltage dividing resistor R1 are the same.

Embodiment 4

Based on the application circuit of the efuse unit in embodiment 2 or 3, a logical AND operation is performed on a programming operation signal PR, a reverse of the read operation signal RD and a word line selection signal WL through an AND gate to output a word line control signal WLC to the WLC port of the efuse unit.

The word line selection signal WL is connected to the WL port of the efuse unit.

Exemplarily, a logical AND operation is performed on the reading operation signal RD and the word line selection signal WL through an AND gate to output a reading operation control signal RDWL to the RDWL port of the efuse unit.

Figure 6:
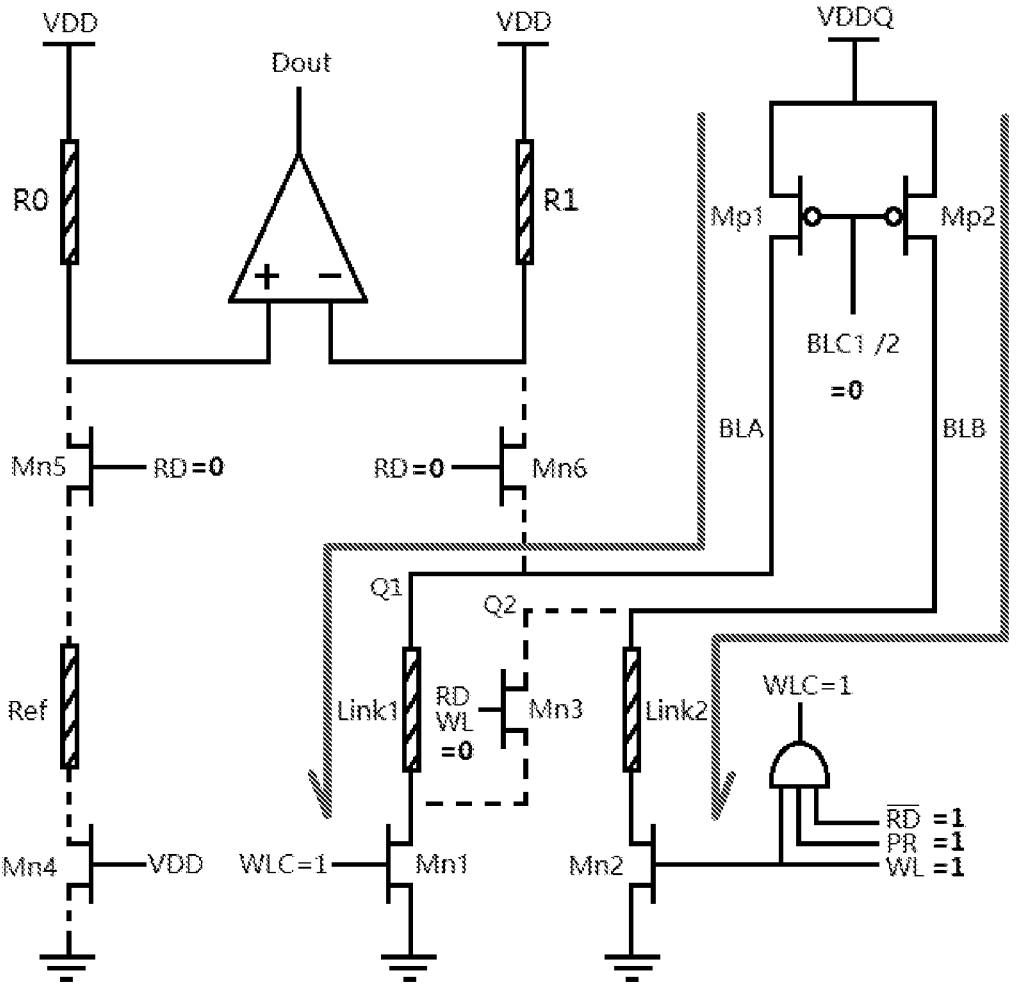
FIG. 6 illustrates a schematic diagram of an application circuit of an efuse unit in a programming operation control state according to an embodiment of the present invention.

The control state of the application circuit of the efuse unit in the programming operation is as illustrated in FIG. 6, where dashed lines represent that the circuit is open.

In the programming operation, the programming operation signal PR=1, the reading operation signal RD=0, and the word line selection signal WL=1, the RDWL port is connected to a lower level RDWL=0, the bit line selection signal BLC=0 (BLC1=0, BLC2=0), and the word line control signal WLC=1, which make the first RMOS transistor Mp1 and the second PMOS transistor Mp2 turn on, the third NMOS transistor Mn3 turn off, and the first NMOS transistor Mn1 and the second NMOS transistor Mn2 turn on. The programming current in the efuse unit flows from the programming power supply VDDQQ through the first PMOS transistor Mp1 and the second PMOS transistor Mp2, respectively, to the Q1 end and Q2 end of the efuse unit, then flows through the first fuse link1 and the second fuse link2, as well as the first NMOS transistor Mn1 and the second NMOS transistor Mn2, and reaches the ground. Electromigration occurs simultaneously on the fuse 1 and the fuse 2, achieving simultaneous programming of the two fuses, resulting in an increase in the resistance of the two fuses.

Figure 7:
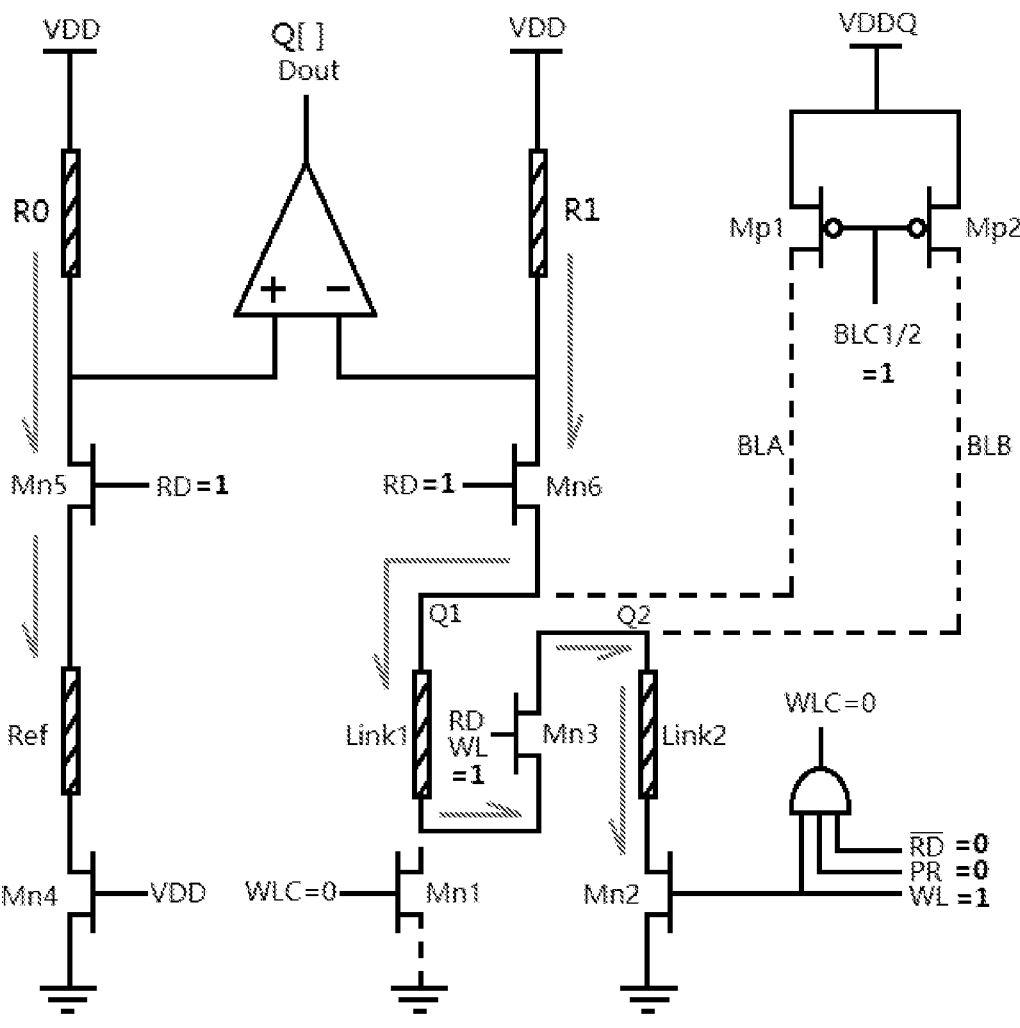
FIG. 7 illustrates a schematic diagram of an application circuit of an efuse unit in a reading operation control state according to an embodiment of the present invention.

The control state of the application circuit of the efuse unit in the reading operation is as illustrated in FIG. 7, where dashed lines represent the circuit is open.

In the reading operation, the programming operation signal PR=0, the reading operation signal RD=1, and the word line selection signal WL=1, the reading operation control signal RDWL=1, the bit line selection signal BLC=1 (BLC1=1, BLC2=1), and the bit line control signal WLC=0, which make the first PMOS transistor Mp1 and the second PMOS transistor Mp2 turn off, the third NMOS transistor Mn3 turn on, the first NMOS transistor Mn1 turn off, and the second NMOS Mn2 transistor Mn2 turn on. A current path is formed sequentially from the working power supply VDD, the first resistor R1, the sixth NMOS transistor Mn6, the Q1 end, the first fuse link1, the third NMOS transistor Mn3, the second fuse link2, and the second NMOS transistor Mn2 to the ground. The resistance of the first fuse link1 and the resistance of the second fuse link2 are connected in series. The component voltage of the resistance thereof and the first resistor R1 is applied to the negative input end of the comparator. The component voltage of the reference resistor Ref and the zeroth resistor R0 is applied to the positive input end of the comparator. The comparator outputs a reading logical value Dout.

What are described above are only exemplary embodiments of the present invention, and are not intended to limit the present invention. Any modifications, equivalent replacements, improvements and the like made within the spirit and principle of the present invention shall be included within the scope of protection of the present invention.

What is claimed is:

1. An application circuit of an efuse unit, comprising:

a first P-channel Metal-Oxide-Semiconductor (PMOS) transistor (Mp1), a second PMOS transistor (Mp2) and a Sense Amplifier (SA) module;

the efuse unit, comprising a first fuse (link1), a second fuse (link2), a first N-channel Metal-Oxide Semiconductor (NMOS) transistor (Mn1), a second NMOS transistor (Mn2) and a third NMOS transistor (Mn3); one end of the first fuse (link1) serving as a Q1 port of the efuse unit, and the other end being connected to a drain end of the third NMOS transistor (Mn3) and a drain end of the first NMOS transistor (Mn1); one end of the second fuse (link2) serving as a Q2 port of the efuse unit and being short-circuited to a source end of the third NMOS transistor (Mn3), and the other end being connected to a drain end of the second NMOS transistor (Mn2); a source end of the first NMOS transistor (Mn1) and a source end of the second NMOS transistor (Mn2) being connected to the ground; a gate end of the third NMOS transistor (Mn3) serving as a reading operation control signal (RDWL) port of the efuse unit; a gate end of the first NMOS transistor (Mn1) serving as a work line control (WLC) port of the efuse unit; and a gate end of the second NMOS transistor (Mn2) serving as a word line (WL) port of the efuse unit;

a drain end (BLA) of the first PMOS transistor (Mp1) being connected to the Q1 port of the efuse unit;

a drain end (BLB) of the second PMOS transistor (Mp2) being connected to the Q2 port of the efuse unit;

source ends of the first PMOS transistor (Mp1) and the second PMOS transistor (Mp2) being short-circuited to a programming power supply (VDDQ);

gate ends of the first PMOS transistor (Mp1) and the second PMOS transistor (Mp2) being short-circuited to a bit line control signal (BLC); and the Q1 port of the efuse unit being connected to the SA module.

2. The application circuit of an efuse unit according to claim 1, wherein the SA module comprises a comparator, a zeroth voltage dividing resistor (R0), a first voltage dividing resistor (R1), a reference resistor (Ref), a fourth NMOS transistor (Mn4), a fifth NMOS transistor (Mn5) and a sixth NMOS transistor (Mn6);

a drain end of the sixth NMOS transistor (Mn6) and one end of the first voltage dividing resistor (R1) are short-circuited to a negative input end of the comparator;

a source end of the sixth NMOS transistor (Mn6) is connected to the Q1 port of the efuse unit;

a drain end of the fifth NMOS transistor (Mn5) and one end of the zeroth voltage dividing resistor (R0) are short-circuited to a positive input end of the comparator;

a source end of the fifth NMOS transistor (Mn5) is connected to one end of the reference resistor (Ref), and a gate end is connected to a reading operation signal (RD);

a drain end of the fourth NMOS transistor (Mn4) is connected to the other end of the reference resistor (Ref), and a source end is connected to the ground (GND); and a gate end of the fourth NMOS transistor (Mn4), the other end of the first voltage dividing resistor (R1) and the other end of the zeroth voltage dividing resistor (R0) are all connected to a working power supply (VDD).

3. The application circuit of an efuse unit according to claim 2, wherein the voltage of the programming power supply (VDDQ) is lower than the voltage of the working power supply (VDD).

4. The application circuit of an efuse unit according to claim 2, wherein the resistance of the zeroth voltage divider (R0) and the resistance of the first voltage dividing resistor (R1) are the same.

5. The application circuit of an efuse unit according to claim 2, wherein a logical AND operation is performed on a programming operation signal (PR), a reverse of the read operation signal (RD) and a word line selection signal (WL) through an AND gate to output a word line control (WLC) signal to the WLC port of the efuse unit.

6. The application circuit of an efuse unit according to claim 5, wherein a logical AND operation is performed on the reading operation signal (RD) and the word line (WL) selection signal through an AND gate to output a reading operation control signal (RDWL) to the RDWL port of the efuse unit.

* * * * *